United States Patent [19]

Dukes et al.

[11] Patent Number: 5,570,035
[45] Date of Patent: Oct. 29, 1996

[54] BUILT-IN SELF TEST INDICATOR FOR AN INTEGRATED CIRCUIT PACKAGE

[75] Inventors: Michael A. Dukes, New Egypt; Gerald T. Michael, Ocean, both of N.J.

[73] Assignee: The United States of America as represented by the Secretary of the Army, Washington, D.C.

[21] Appl. No.: 426,261

[22] Filed: Jan. 31, 1995

[51] Int. Cl.⁶ .................................................. G01R 31/28
[52] U.S. Cl. .......................... 324/763; 324/96; 340/514
[58] Field of Search ........................... 324/96, 501, 537; 328/763; 340/514, 534, 595; 362/800; 358/106

[56] References Cited

U.S. PATENT DOCUMENTS 5,268,635  12/1993  Bortolini et al. ...................... 324/96
5,270,655  12/1993  Tomita .................................. 324/501

*Primary Examiner*—Kenneth A. Wieder
*Assistant Examiner*—Barry C. Bowser
*Attorney, Agent, or Firm*—Michael Zelenka; William H. Anderson

[57] ABSTRACT

Apparatus for providing a direct indication of the failure of an electronic circuit including a built-in self test circuit which performs an initial test on the electronic circuit and having a visual indicator coupled thereto which becomes activated when the self test circuit senses a failure of the electronic circuit upon power being supplied thereto or during operation. The electronic circuit with the built-in test feature consists of an integrated circuit chip or a multi-chip module encapsulated in a package with the indicator means visible therethrough. The indicator consists either of a light emitting diode or fusible material which changes its appearance and becomes visible through the package upon being activated by the built-in self test circuit.

12 Claims, 1 Drawing Sheet

5,570,035

BUILT-IN SELF TEST INDICATOR FOR AN INTEGRATED CIRCUIT PACKAGE

GOVERNMENT INTEREST

The invention described herein may be manufactured, used, and licensed by or for the Government of the United States of America without the payment to us of any royalty thereon.

FIELD OF THE INVENTION

This invention relates in general to built-in test apparatus for electronic circuits.

BACKGROUND OF THE INVENTION

This invention relates more particularly to built-in self test circuitry for integrated circuits and more particularly to an integrated circuit chip of digital microelectronic circuits or a multi-chip module that is encapsulated in packaging material and which incorporates its own internal built-in self test circuit for providing a visual feedback to a tester through the packaging material that the integrated circuit chip or multi-chip module has failed.

Currently integrated circuit chips including digital microelectronic circuits that are manufactured from new designs typically allocate one pin or several pins for test control, test simulation and test result collection. The chip is analyzed through the use of special external equipment or on-board electronics to determine that the circuit under test is operating correctly or incorrectly. In any case, there is no direct feedback, except through test equipment or on-board circuitry, that is provided to the individual testing or using the particular chip or multi-chip module that a chip failure has occurred, even though the built-in test equipment has determined that the chip(s) is not functioning properly.

Accordingly, it is an object of the present invention to provide an improvement in means for testing electronic circuitry.

It is another object of the invention to provide a testing circuit that will provide a visual feedback to the tester that the circuit under test has failed.

It is a further object of the invention to provide an internal built-in self test circuit and indicator that provides an immediate visual cue to an individual testing or operating the chip or module that it is no longer passing its own internal built-in test procedure and therefore is inoperable.

SUMMARY

Briefly, the foregoing and other objects are provided by apparatus for providing a direct indication of the failure of an electronic circuit including a built-in self test circuit which performs an initial test on the electronic circuit and having indicator means coupled thereto which becomes activated when the self test circuit senses a failure of the electronic circuit when power is supplied thereto. The electronic circuit with the built-in test feature comprises an integrated circuit chip or a multi-chip module either of which can be comprised of one or more digital microelectronic circuits (DMC). The indicator means comprises either a light emitting diode or fusible material which becomes visible through the intergrated circuit chip or multi-chip module package upon being activated by the built-in self test circuit.

BRIEF DESCRIPTION OF THE DRAWINGS

These and other objects, features and details of the invention will become apparent in light of the ensuing detailed disclosure, and particularly in light of the drawings wherein.

DETAILED DESCRIPTION OF THE PREFERRED EMBODIMENTS

Figure 1:
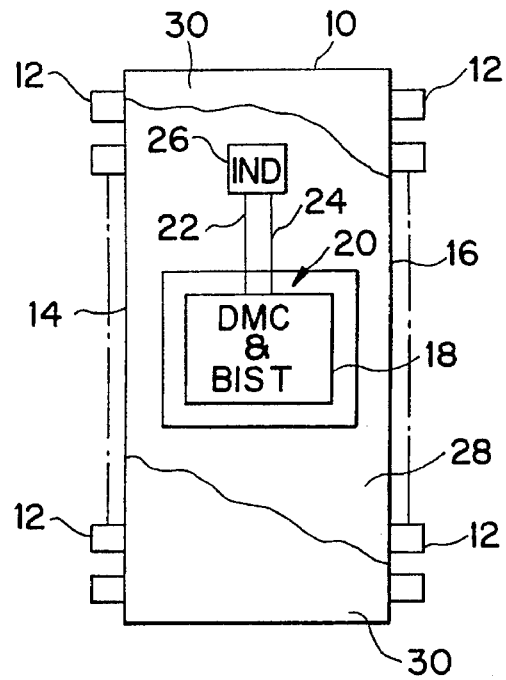
FIG. 1 is an electrical block diagram illustrative of a first embodiment of the invention.
Figure 3A:
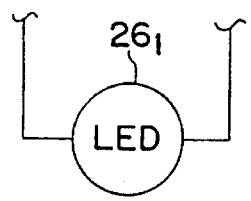
FIG. 3A is illustrative of one type of indicator element which can be utilized with the embodiment shown in FIGS. 1 and 2.
Figure 3B:
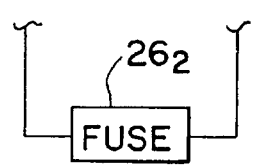
FIG. 3B is illustrative of a second type of indicator element which can be utilized with the embodiments shown in FIGS. 1 and 2.

FIG. 1 discloses a dual in-line package 10 having a plurality of flat generally rectangular contacts 12 projecting from the longer dimensioned sides 14 and 16 of the package 10. Reference numeral 18 denotes an integrated circuit chip including built-in self test (BIST) circuitry with the integrated circuit being comprised of one or more digital microelectronic circuits (DMC) not shown. The intergrated circuit 18 is located in a die region 20 fabricated into the package 10. A pair of leads 22 and 24 connected to the BIST portion of the intergrated circuit 18 are coupled to an electrically activated indicator device 26 which is flush with the outer surface 28 of the package 10 and is covered with translucent material 30. The indicator device 26 is comprised of a light emitting diode (LED) $26_1$ as shown in FIG. 3A or a device $26_2$ as shown in FIG. 3B which includes fusible material which changes its appearance when activated by the BIST circuitry. This would permit anyone, even an unskilled operator or observer, to immediately detect a part failure. The only limitation is that the part must be active i.e., power must be applied to the circuit in order to provide the observer with notification of a failed integrated circuit. Also this approach assumes that BIST circuitry is operating as intended.

Accordingly, the indicator device comprising either the LED $26_1$ or the fusible material-type device $26_2$ is operated by the BIST by means of a signal coupled thereto via circuit leads 22 and 24. Thus, when the intergrated circuit 18 is initially powered on, the BIST performs an initial test of the function of the DMC circuitry. If required, the BIST may also be activated during operation. Should the circuitry pass the test, no further action is warranted on the part of the BIST and the indicator 26 will not be activated. On the other hand, should the intergrated circuit 18 fail the initial test, the BIST would activate the indicator 26 comprising the LED $26_1$ or the fusible material device $26_2$ for example by setting all input/output pins to a high-impedance state.

Figure 2:
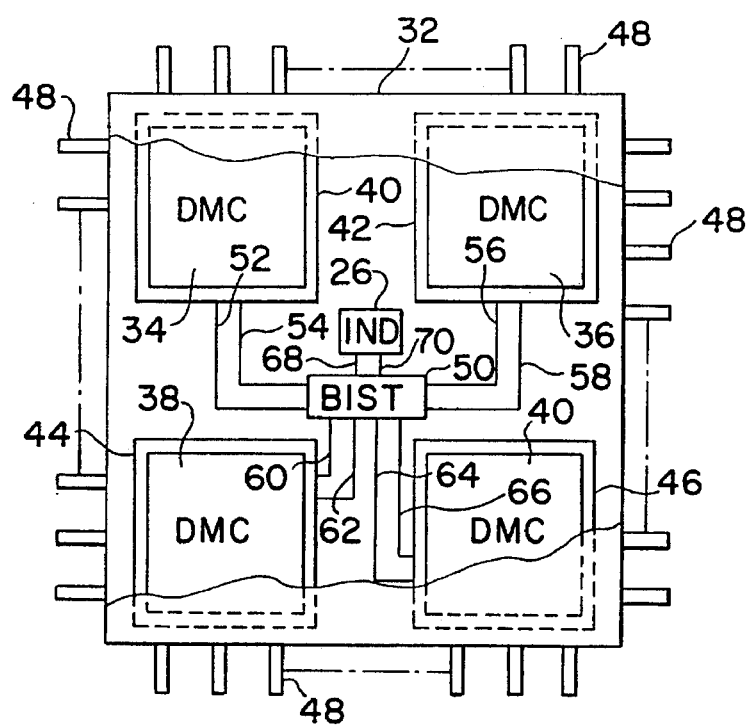
FIG. 2 is a block diagram illustrative of a second embodiment of the invention.

Considering now the second embodiment of the invention as shown in FIG. 2, reference no. 32 denotes a multi-intergrated circuit module (MCM) which includes, for example, four intergrated circuit chips 34, 36, 38 and 40 located in the die regions 40, 42, 44 and 46. The integrated circuit intergrated circuits 34, 36, 38 and 40 are connected to the outside via connector pins 48 located around the outside edges of the module 32 or under the module. Whereas in the first embodiment shown in FIG. 1, the integrated circuit 18 included its own dedicated BIST circuit therein, in the second embodiment a single built-in self test BIST circuit 50 is connected to all four intergrated circuits 34, 36, 38 and 40 by separate pairs of leads 52, 54; 56, 58; 60, 62; and 64, 66. A single indicator 26 is connected to the BIST 50 by means of circuit leads 68 and 70. When power is applied to the module 32 the BIST 50 sequentially performs an initial test of the function of each of the integrated circuit intergrated circuits 34, 36, 38 and 40. As in the first embodiment, the BIST could be activated during operation as well. Should any one of the four intergrated circuits 34, 36, 38 and 40 fail the test, the indicator 36 will be activated indicating that one or more of the intergrated circuits has failed. Again the indicator 26 is comprised of a light-emitting diode 26₁ or a device 26₂ that includes fusible material that changes its appearance upon being activated. Accordingly, this invention has particular application where a large investment in expensive, durable-item goods that contain systems built with integrated circuit intergrated circuits or modules of circuit intergrated circuits and which are integrated with other equipment. Examples of such items include aircraft, construction equipment as well as diverse types of factory equipment. In many instances, replacing a module such as a DMC is only required to make a system functional again; however, altering a PC board to accommodate BIST inserted into a DMC is not always feasible. Thus if a DMC can be redesigned with its own internal BIST such that surrounding structure is not compromised, then additional testability can be used in areas where none existed before.

For new integrated circuit modules, manufacture and testing of boards can be performed with greater speed since, by placing the burden of notification of test failure on each module, most of the testing can be performed in parallel on the DMCs where the board is powered on before a board level tester is activated. Board level tests within only have to be made for inter DMC connection analysis rather than performing both a functional and connection analysis as typically required with a state-of-the-art apparatus.

Having thus shown and described what is at present considered to be the preferred embodiments of the invention, it should be noted that the same has been made by way of illustration and not limitation. Accordingly, all modifications, alterations, and changes coming within the spirit and scope of the invention as set forth in the independent claims are herein meant to be included.

What is claimed is:

1. A built-in self test apparatus for providing a visible indication of a failure of an electronic circuit, comprising:
    an integrated circuit chip;
    a built-in self test circuit integrally formed within said integrated circuit chip, said built-in self test circuit performing an operational test on said integrated circuit chip; and
    visible indicator means coupled to said built-in self test circuit which becomes activated when said built-in self test circuit senses a failure of said intergrated circuit when power is supplied thereto, said visible indicator means being formed as an integral part of a packaging for said intergrated circuit chip.

2. The apparatus as defined by claim 1 wherein said built-in self test circuit generates an electrical output signal upon sensing said failure and wherein said visible indicator means is responsive to and becomes activated by said output signal.

3. The apparatus as defined by claim 2 wherein said visible indicator means comprises a light emitting device producing visible emissions.

4. The apparatus as defined by claim 3 wherein said light emitting device comprises a light emitting diode producing visible emissions.

5. The apparatus as defined by claim 2 wherein said visible indicator means includes material which permanently changes appearance upon being activated in response to said output signal.

6. A built-in self test apparatus for providing a visible indication of a failure of an electronic circuit, comprising:
    an integrated circuit chip;
    a built-in self test circuit integrally formed within said integrated circuit chip, said built-in self test circuit performing an operational test on said integrated circuit chip and generating an electrical output signal upon sensing a failure of said integrated circuit chip; and
    visible indicator means, coupled to said built-in self test circuit and responsive to said electrical output signal, for indicating the failure of said integrated circuit chip when power is supplied thereto, said visible indicator means including fusible material which becomes activated and changes appearance in response to said electrical output signal, said fusible material being formed as an integral part of a packaging for said integrated circuit chip.

7. A built-in self test apparatus for providing a visible indication of a failure of an electronic circuit, comprising:
    a multi-intergrated circuit chip module having a plurality of intergrated circuit chips;
    a built-in self test circuit integrally formed within said multi-chip module, said built-in self test circuit performing an operational test on said integrated circuit chips; and
    visible indicator means coupled to said built-in self test circuit which becomes activated when said built-in self test circuit senses a failure of said intergrated circuit chips when power is supplied thereto, said visible indicator means being formed as an integral part of a packaging for said multi-chip module.

8. The apparatus as defined by claim 7 wherein said built-in self test circuit generates an electrical output signal upon sensing said failure and wherein said visible indicator means is responsive to and becomes activated by said output signal.

9. The apparatus as defined by claim 8 wherein said visible indicator means comprises a light emitting device producing visible emissions.

10. The apparatus as defined by claim 9 wherein said light emitting device comprises a light emitting diode producing visible emissions.

11. The apparatus as defined by claim 8 wherein said visible indicator means includes material which permanently changes appearance upon being activated in response to said output signal.

12. A built-in self test apparatus for providing a visible indication of a failure of an electronic circuit, comprising:
    a multi-chip module having a plurality of integrated circuit chips:
    a built-in self test circuit integrally formed within said multi-chip module, said built-in self test circuit performing an operational test on said integrated circuit chips and generating an electrical output signal upon sensing a failure of said integrated circuit chips; and visible indicator means, coupled to said built-in self test circuit and responsive to said electrical output signal, for indicating the failure of said integrated circuit chips when power is supplied thereto, said visible indicator means including fusible material which becomes activated and changes appearance in response to said electrical output signal said fusible material being formed as an integral part of a packaging for said multi-chip module.

\* \* \* \* \*